(12) United States Patent
Kwon et al.

(10) Patent No.: US 10,978,844 B2
(45) Date of Patent: Apr. 13, 2021

(54) POGO MODULE AND ELECTRONIC DEVICE COMPRISING SAME

(71) Applicant: Samsung Electronics Co., Ltd., Suwon-si (KR)

(72) Inventors: Ki-Young Kwon, Yongin-si (KR); Ki-Won Kim, Suwon-si (KR); Ji-Min Kim, Busan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/488,547

(22) PCT Filed: Feb. 8, 2018

(86) PCT No.: PCT/KR2018/001690
§ 371 (c)(1),
(2) Date: Aug. 23, 2019

(87) PCT Pub. No.: WO2018/155854
PCT Pub. Date: Aug. 30, 2018

(65) Prior Publication Data
US 2020/0014163 A1 Jan. 9, 2020

(30) Foreign Application Priority Data
Feb. 24, 2017 (KR) .................. 10-2017-0025071

(51) Int. Cl.
*H01R 12/71* (2011.01)
*H01R 39/64* (2006.01)
(Continued)

(52) U.S. Cl.
CPC ......... *H01R 39/643* (2013.01); *H01R 12/714* (2013.01); *H01R 33/74* (2013.01);
(Continued)

(58) Field of Classification Search
CPC .............. H01R 12/714; H01R 13/2421; H01R 13/2478; H01R 13/2485
See application file for complete search history.

(56) References Cited

U.S. PATENT DOCUMENTS

| 6,548,982 B1 | 4/2003 | Papanikolopoulos et al. |
| 6,758,682 B1 * | 7/2004 | Kosmala ............ H01R 13/2421 439/66 |

(Continued)

FOREIGN PATENT DOCUMENTS

| KR | 20-0164636 Y1 | 2/2000 |
| KR | 10-0734296 B1 | 7/2007 |

(Continued)

OTHER PUBLICATIONS

ISA/KR, International Search Report and Written Opinion of the International Searching Authority, International Application No. PCT/KR2018/001690, dated May 18, 2018, 11 pages.

*Primary Examiner* — Tho D Ta

(57) ABSTRACT

Various embodiments relating to a pogo module comprising a pogo pin for maintaining an electrical connection state when an electronic device is rotated and not rotated are disclosed, and according to one embodiment, the pogo module comprises: first and second housings; module circuit boards provided inside the first and second housings; at least one pogo pin provided to the module circuit board and comprising a rotatable structure electrically connected to at least one electrode pattern included in a printed circuit board of the electronic device; and a support body coupled to the module circuit board to support the at least one pogo pin, wherein the rotatable structure can maintain an electrical connection state with the at least one electrode pattern when the electronic device is rotated or not rotated. In addition, various other embodiments are possible.

14 Claims, 11 Drawing Sheets

(51) Int. Cl.
    *H01R 33/74*     (2006.01)
    *H05K 1/11*     (2006.01)
    *H01R 13/24*     (2006.01)

(52) U.S. Cl.
    CPC .......... *H05K 1/119* (2013.01); *H01R 13/2421* (2013.01); *H01R 13/2478* (2013.01); *H01R 13/2485* (2013.01); *H05K 2201/09027* (2013.01); *H05K 2201/0939* (2013.01)

(56) References Cited

U.S. PATENT DOCUMENTS

| | | | |
|---|---|---|---|
| 7,789,719 B1 * | 9/2010 | Yin | H01R 13/2421 |
| | | | 439/824 |
| 8,668,529 B2 * | 3/2014 | Park | H01R 13/2435 |
| | | | 439/700 |
| 2007/0141877 A1 | 6/2007 | Lee et al. | |
| 2010/0209752 A1 | 8/2010 | Lerner et al. | |
| 2015/0126077 A1 * | 5/2015 | Van Ekstrom | H01R 13/2421 |
| | | | 439/700 |
| 2016/0127643 A1 | 5/2016 | Huerta et al. | |

FOREIGN PATENT DOCUMENTS

| | | |
|---|---|---|
| KR | 10-2011-0120696 A | 11/2011 |
| KR | 10-1624882 B1 | 5/2016 |
| KR | 10-2016-0092366 A | 8/2016 |

\* cited by examiner

POGO MODULE AND ELECTRONIC DEVICE COMPRISING SAME

CROSS-REFERENCE TO RELATED APPLICATIONS

This application is a National Phase Entry of PCT International Application No. PCT/KR2018/001690, which was filed on Feb. 8, 2018, and claims priority to Korean Patent Application No. 10-2017-0025071, which was filed on Feb. 24, 2017, the contents of which are incorporated herein by reference.

BACKGROUND

1. Field

Various embodiments of the present disclosure relate to a pogo module including a pogo pin.

2. Description of the Related Art

Recently, various electronic devices such as a cellular phone, an MP3 player, a portable multimedia player (PMP), a tablet personal computer (PC), a Galaxy tab, a smart phone, an i-pad, an electronic book (e-book) terminal, a home device, etc. have been provided to users who may enjoy various contents while carrying the electronic devices with them.

The electronic device may include a display, a rotating body, and a main body supporting rotation of the body, in which the rotating body and the main body may use a cable for electric connection. For example, a connection terminal included in the body is electrically connected to a connection terminal of the body via the cable of the main body, such that a twist or interference of a cable included in the electronic device may occur during rotation of the body, causing malfunction of the electronic device.

SUMMARY

A conventional electronic device is structured such that a main body is provided in a lower portion and a rotating body is arranged on the main body, in which the lower main body is electrically connected to the upper rotating body and an electrical connection therebetween is maintained, by using a cable, causing a twist or interruption of a cable mounted in the electronic device during rotation of the body.

Even when the main body is supported in a lower portion thereof, an electrical connection is made to the body and is maintained, by using a cable.

Therefore, various embodiments of the present disclosure provide a pogo module including a pogo pin for making and at the same time, maintaining an electrical connection without a cable in rotation or non-rotation of an electronic device.

According to various embodiments of the present disclosure, a pogo module includes a first housing and a second housing, a module circuit board provided in the first housing and the second housing, at least one pogo pin provided in the module circuit board and including a rotatable structure electrically connected to at least one electrode pattern included in a printed circuit board of an electronic device, and a support body coupled with the module circuit board to support the at least one pogo pin, in which the rotatable structure maintains an electrical connection with the at least one electrode pattern in rotation or non-rotation of the electronic device.

According to various embodiments of the present disclosure, an electronic device including a pogo module includes a first rotating housing including a plurality of first driving motors and a plurality of first components therein and rotating by the plurality of first driving motors, a second rotating housing rotatably facing the first rotating housing, including a plurality of second driving motors and a plurality of second components therein, and rotating by the plurality of second driving motors, a rotating body included in any one of the first rotating housing and the second rotating housing, including a printed circuit board including at least one electrode pattern, and rotating, and a stationary body included in any one of the first rotating housing and the second rotating housing, being fixed on a ground, and including the pogo module that is electrically connected to the at least one electrode pattern, facing the at least one electrode pattern, in which the pogo module includes a first housing and a second housing, a module circuit board provided in the first housing and the second housing, at least one pogo pin provided in the module circuit board and including a rotatable structure electrically connected to the at least one electrode pattern, and a support body coupled with the module circuit board to support the at least one pogo pin and the module circuit board, in which the rotatable structure includes the pogo module that maintains an electrical connection with the at least one electrode pattern in rotation or non-rotation of the first rotating housing and the second rotating housing.

According to various embodiments of the present disclosure, a connector module includes a first housing and a second housing, a circuit board provided in the first housing and the second housing, at least one connector provided in the circuit board and including a rotatable structure electrically connected to at least one electrode pattern included in a printed circuit board of an electronic device, and a support body coupled with the circuit board to support the at least one connector, in which the rotatable structure maintains an electrical connection with the at least one electrode pattern in rotation or non-rotation of the electronic device.

According to various embodiments of the present disclosure, with a pogo module including a pogo pin that makes and maintains an electrical connection in rotation or non-rotation of an electronic device, components of the electronic device may be electrically connected without a cable used for an electrical connection in rotation or various movement of the electronic device, twist and disconnection caused by the cable may be prevented, and an electrical short-circuit accident of a product and a damage of a component may be prevented from occurring due to a contact of the cable with the component of the electronic device. Therefore, the quality and reliability of the product may be improved by preventing malfunction of the product.

DETAILED DESCRIPTION

Figure 1:
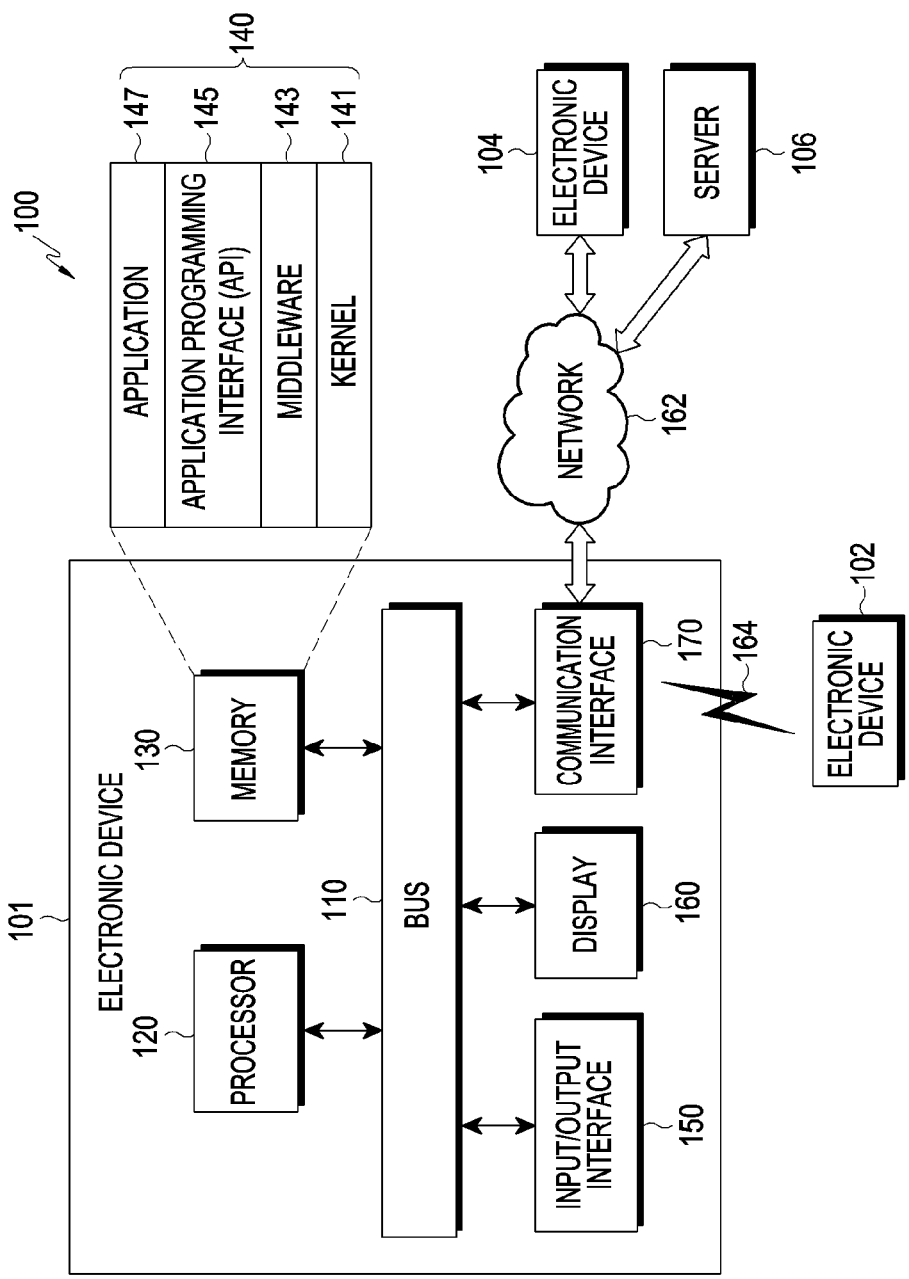
FIG. 1 illustrates a network environment including an electronic device according to various embodiments of the present disclosure.

Hereinafter, various embodiments of the present disclosure will be disclosed with reference to the accompanying drawings. However, embodiments and terms used therein are not intended to limit the present disclosure to particular embodiments, and it should be construed as including various modifications, equivalents, or alternatives according to the embodiments of the present disclosure. With regard to the description of the drawings, similar reference numerals may be used to refer to similar or related elements. It is to be understood that a singular form of a noun corresponding to an item may include one or more of the things, unless the relevant context clearly indicates otherwise. In the present disclosure, an expression such as "A or B," "at least one of A or/and B," or "one or more of A or B" may include all possible combinations of together listed items. Expressions such as "first," "second," "primarily," or "secondary," used herein may represent various elements regardless of order and/or importance and do not limit corresponding elements. When it is described that an element (such as a first element) is "operatively or communicatively coupled with/to" or "connected" to another element (such as a second element), the element can be directly connected to the other element or can be connected to the other element through another element (e.g., a third element).

An expression "configured to (or set)" used in the present disclosure may be replaced with, for example, "suitable for," "having the capacity to," "adapted to," "made to," "capable of," or "designed to" according to a situation. Alternatively, in some situation, an expression "apparatus configured to" may mean that the apparatus "can" operate together with another apparatus or component. For example, a phrase "a processor configured (or set) to perform A, B, and C" may be a dedicated processor (e.g., an embedded processor) for performing a corresponding operation or a generic-purpose processor (such as a central processing unit (CPU) or an application processor) that can perform a corresponding operation by executing at least one software program stored at a memory device.

An electronic device according to various embodiments of the present disclosure may include at least one of, for example, a smartphone, a tablet personal computer (PC), a mobile phone, a video phone, an electronic-book (e-book) reader, a desktop PC, a laptop PC, a netbook computer, a workstation, a server, a personal digital assistant (PDA), a portable multimedia player (PMP), an MP3 player, mobile medical equipment, a camera, or a wearable device. Examples of the wearable device may include at least one of an accessory type (e.g., a watch, a ring, a bracelet, an anklet, a necklace, glasses, contact lenses, head-mounted device (HMD), etc.), a fabric or cloth-integrated type (e.g., electronic clothing, etc.), a body-attached type (e.g., a skin pad, a tattoo, etc.), a body implantable circuit, or the like. In some embodiments, the electronic device may include, for example, at least one of a television (TV), a digital video disk (DVD) player, audio equipment, a refrigerator, an air conditioner, a vacuum cleaner, an oven, a microwave oven, a laundry machine, an air cleaner, a set-top box, a home automation control panel, a security control panel, a media box (e.g., Samsung HomeSync™, Apple TV™, or Google TV™), a game console (e.g., Xbox™ or PlayStation™), an electronic dictionary, an electronic key, a camcorder, or an electronic frame.

In other embodiments, the electronic device may include at least one of various medical equipment (e.g., various portable medical measurement devices (a blood glucose meter, a heart rate measuring device, a blood pressure measuring device, a body temperature measuring device, etc.), magnetic resonance angiography (MRA), magnetic resonance imaging (MRI), computed tomography (CT), an imaging device, or an ultrasonic device), a navigation system, a global navigation satellite system (GNSS), an event data recorder (EDR), a flight data recorder (FDR), a vehicle infotainment device, electronic equipment for ships (e.g., a navigation system and gyro compass for ships), avionics, a security device, a vehicle head unit, an industrial or home robot, an automatic teller's machine (ATM), a point of sales (POS), Internet of things (e.g., electric bulbs, various sensors, electricity or gas meters, sprinkler devices, fire alarm devices, thermostats, streetlights, toasters, exercise machines, hot-water tanks, heaters, boilers, and so forth). According to some embodiments, the electronic device may include a part of furniture, a building/structure or a part of a vehicle, an electronic board, an electronic signature receiving device, a projector, and various measuring instruments (e.g., a water, electricity, gas, electric wave measuring device, etc.). According to various embodiments, the electronic device may be flexible or may be a combination of two or more of the above-described various devices. According to an embodiment of the disclosure, the electronic devices are not limited to those described above. Herein, the term "user" used in various embodiments of the present disclosure may refer to a person who uses the electronic device or a device using the electronic device (e.g., an artificial intelligence electronic device).

Referring to FIG. 1, an electronic device 101 in a network environment 100 according to various embodiments of the present disclosure is disclosed. The electronic device 101 may include a bus 110, a processor 120, a memory 130, an input/output (I/O) interface 150, a display 160, and a communication interface 170. According to some embodiments, the electronic device 101 may omit at least one of the foregoing elements or may further include other elements. The bus 110 may include a circuit for connecting, e.g., the elements 110 to 170 and delivering communication (e.g., a control message or data) between the elements 110 to 170. The processor 120 may include one or more of a central processing unit (CPU), an application processor (AP), and a communication processor (CP). The processor 120 may perform operations or data processing for control or communication of, for example, at least one other elements of the electronic device 101.

The memory 130 may include a volatile or nonvolatile memory. The memory 130 may store, for example, instructions or data associated with at least one other elements of the electronic device 101. According to an embodiment, the memory 130 may store software or a program 140. The program 140 may include at least one of, for example, a kernel 141, middleware 143, an application programming interface (API) 145, or an application program (or "application") 147, and the like. At least some of the kernel 141, the middleware 143, and the API 145 may be referred to as an operating system (OS). The kernel 141 may control or manage, for example, system resources (e.g., the bus 110, the processor 120, the memory 130, etc.) used to execute operations or functions implemented in other programs (e.g., the middleware 143, the API 145, or the application program 147). The kernel 141 provides an interface through which the middleware 143, the API 145, or the application program 147 accesses separate components of the electronic device 101 to control or manage the system resources.

The middleware 143 may work as an intermediary for allowing, for example, the API 145 or the application program 147 to exchange data in communication with the kernel 141. In addition, the middleware 143 may process one or more task requests received from the application program 147 based on priorities. For example, the middleware 143 may give a priority for using a system resource (e.g., the bus 110, the processor 120, the memory 130, etc.) of the electronic device 101 to at least one of the application programs 147, and may process the one or more task requests. The API 145 is an interface used for the application 147 to control a function provided by the kernel 141 or the middleware 143, and may include, for example, at least one interface or function (e.g., an instruction) for file control, window control, image processing or character control. The I/O interface 150 may deliver, for example, an instruction or data input from a user or another external device to other component(s) of the electronic device 101, or output an instruction or data received from other component(s) of the electronic device 101 to a user or another external device.

The display 160 may include, for example, a liquid crystal display (LCD), a light emitting diode (LED) display, an organic light emitting diode (OLED) display, a microelectromechanical system (MEMS) display, or an electronic paper display. The display 160 may, for example, display various contents (e.g., a text, an image, a video, an icon, a symbol, etc.) to users. The display 160 may include a touchscreen, and receives a touch, a gesture, proximity, or a hovering input, for example, by using an electronic pen or a part of a body of a user. The communication interface 170 establishes communication between the electronic device 101 and an external device (e.g., the vehicle device 102, the electronic device 104, or the server 106). For example, the communication interface 170 may be connected to a network 162 through a wireless communication or wired communication to communicate with an external device (e.g., the second external electronic device 104 or the server 106).

Wireless communication may include a cellular communication protocol using at least one of, for example, long-term evolution (LTE), LTE advance (LTE-A), code division multiple access (CDMA), wideband CDMA (WCDMA), universal mobile telecommunications system (UMTS), wireless broadband (WiBro), global system for mobile communications (GSM), or the like. According to an embodiment, the wireless communication may include at least one of Wireless Fidelity (WiFi), Light Fidelity (LiFi), Bluetooth, Bluetooth Low Energy (BLE), Zigbee, near field communication (NFC), magnetic secure transmission (MST), radio frequency (RF), or a body area network (BAN), as illustrated by an element 164 of FIG. 1. According to an embodiment, the wireless communication may include a global navigation satellite system (GNSS). The GNSS may include, for example, at least one of a global positioning system (GPS), a global navigation satellite system (Glonass), a Beidou navigation satellite system ("Beidou"), and Galileo, the European global satellite-based navigation system. Hereinbelow, "GPS" may be used interchangeably with "GNSS". The wired communication may include, for example, at least one of a universal serial bus (USB), a high definition multimedia interface (HDMI), a recommended standard (RS)-232, power line communication, a plain old telephone service (POTS), and so forth. The network 162 may include a telecommunications network, for example, at least one of a computer network (e.g., a local area network (LAN) or a wide area network (WAN)), Internet, and a telephone network.

Each of the first external electronic device 102 and the second external electronic device 104 may be a device of the same type as or a different type than the electronic device 101. According to various embodiments of the present disclosure, some or all of operations performed by the electronic device 101 may be performed in another electronic device or a plurality of electronic devices (e.g., the electronic device 102 or 104, or the server 106). According to an embodiment of the present disclosure, when the electronic device 101 has to perform a function or a service automatically or at a request, the electronic device 101 may request another device (e.g., the electronic devices 102 or 104 or the server 106) to perform at least some functions associated with the function or the service instead of or in addition to executing the function or the service. The another electronic device (e.g., the electronic device 102 or 104 or the server 106) may execute the requested function or additional function and deliver the execution result to the electronic device 101. The electronic device 101 may then process or further process the received result to provide the requested function or service. To that end, a cloud computing, distributed computing, or client-server computing technology may be used, for example.

Figure 2:
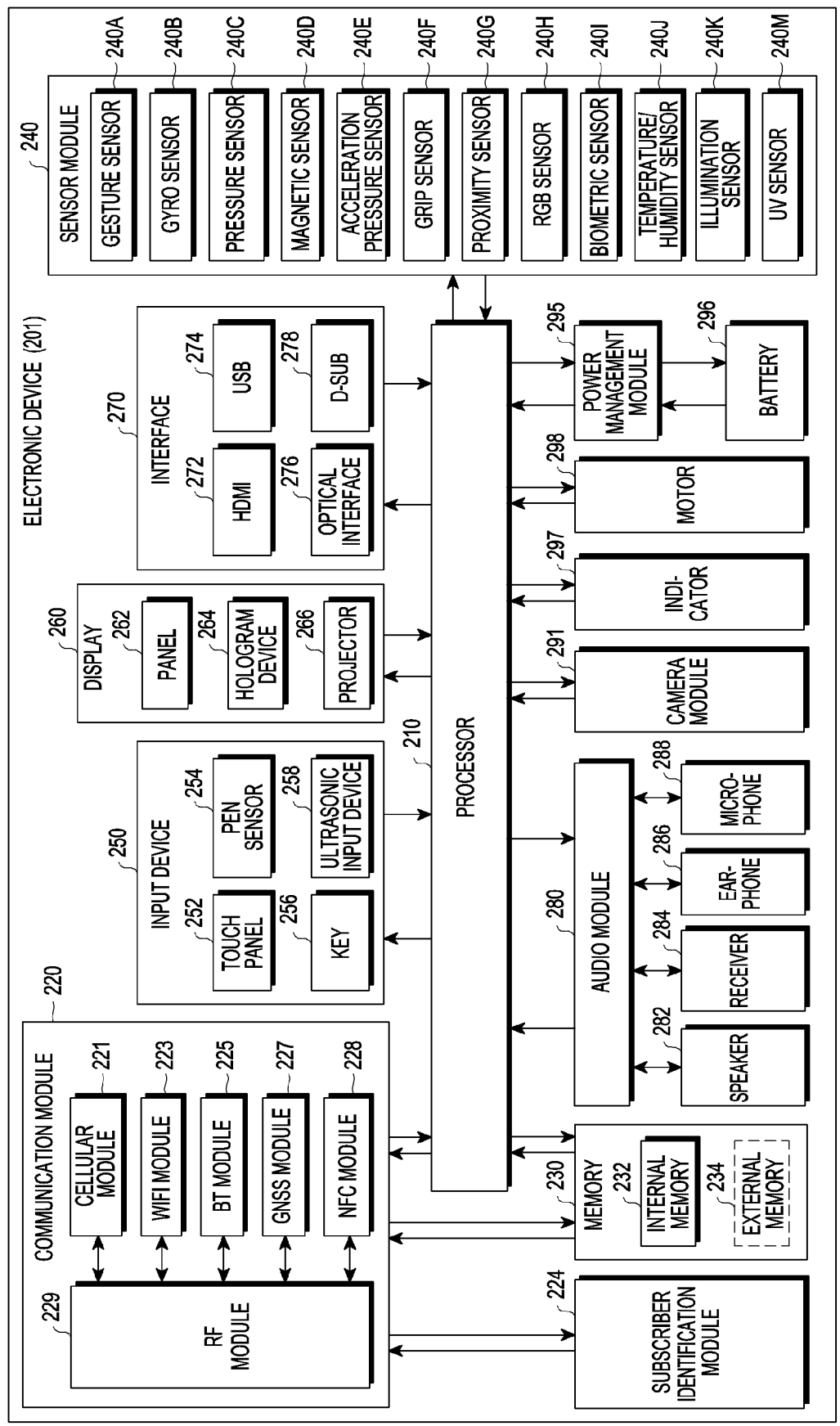
FIG. 2 is a block diagram of an electronic device according to various embodiments of the present disclosure.

FIG. 2 is a block diagram of an electronic device 201 according to various embodiments of the present disclosure. The electronic device 201 may form the entire electronic device 101 illustrated in FIG. 1 or a part of the electronic device 101 illustrated in FIG. 1. The electronic device 201 may include one or more processors (e.g., application processors (APs)) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298. The processor 210 controls multiple hardware or software components connected to the processor 210 by driving an operating system (OS) or an application program, and performs processing and operations with respect to various data. The processor 210 may be implemented with, for example, a system on chip (SoC). According to an embodiment of the present disclosure, the server 210 may include a graphic processing unit (GPU) or an image signal processor. The processor 210 may include at least some of the elements illustrated in FIG. 2 (e.g., the cellular module 221). The processor 210 loads an instruction or data received from at least one of other elements (e.g., a non-volatile memory) into a volatile memory to process the instruction or data, and stores result data in the non-volatile memory.

The communication module 220 may have a configuration that is the same as or similar to the communication interface 170. The communication module 220 may include, for example, the cellular module 221, a WiFi module 223, a Bluetooth (BT) module 225, a GNSS module 227, an NFC module 228, and a radio frequency (RF) module 229. The cellular module 221 may provide, for example, a voice call, a video call, a text service, or an Internet service over a communication network. According to an embodiment of the present disclosure, the cellular module 221 may identify and authenticate the electronic device 201 in a communication network by using the SIM 224 (e.g., a SIM card). According to an embodiment of the present disclosure, the cellular module 221 may perform at least one of functions that may be provided by the processor 210. According to an embodiment of the present disclosure, the cellular module 221 may include a communication processor (CP). According to some embodiment, at least some (e.g., two or more) of the cellular module 221, the WiFi module 223, the BT module 225, the GNSS module 227, and the NFC module 228 may be included in one integrated chip (IC) or IC package. The RF module 229 may, for example, transmit and receive a communication signal (e.g., an RF signal). The RF module 229 may include a transceiver, a power amp module (PAM), a frequency filter, a low noise amplifier (LNA), or an antenna. According to another embodiment of the present disclosure, at least one of the cellular module 221, the WiFi module 223, the BT module 225, the GNSS module 227, or the NFC module 228 may transmit and receive an RF signal through the separate RF module. The SIM 224 may, for example, include a card including a SIM or an embedded SIM, and may include unique identification information (e.g., an integrated circuit card identifier (IC-CID) or subscriber information (e.g., an international mobile subscriber identity (IMSI)).

The memory 230 (e.g., the memory 130) may, for example, include an internal memory 232 and/or an external memory 234. The internal memory 232 may, for example, include at least one of a volatile memory (e.g., dynamic random access memory (DRAM), static RANI (SRAM), synchronous dynamic RAM (SDRAM), etc.), and a non-volatile memory (e.g., one time programmable read only memory (OTPROM), programmable ROM (PROM), erasable and programmable ROM (EPROM), electrically erasable and programmable ROM (EEPROM), etc.), mask ROM, flash ROM, a flash memory, and a solid state drive (SSD). The external memory 234 may further include flash drive, for example, compact flash (CF), secure digital (SD), micro-SD, mini-SD, extreme Digital (xD), a multi-media card (MMC), or a memory stick. The external memory 234 may be functionally or physically connected with the electronic device 201 through various interfaces.

The sensor module 240 measures physical quantity or senses an operation state of the electronic device 201 to convert the measured or sensed information into an electric signal. The sensor module 240 may, for example, include at least one of a gesture sensor 240A, a gyro sensor 240B, a pressure sensor 240C, a magnetic sensor 240D, an acceleration sensor 240E, a grip sensor 240F, a proximity sensor 240G, a color sensor 240H (e.g., red/green/blue (RGB) sensor), a biometric sensor 240I, a temperature/humidity sensor 240J, an illumination sensor 240K, and an ultraviolet (UV) sensor 240M. Additionally or alternatively, the sensor module 240 may include an E-nose sensor (not shown), an electromyography (EMG) sensor (not shown), an electroencephalogram (EEG) sensor (not shown), an electrocardiogram (ECG) sensor (not shown), an infrared (IR) sensor, an iris sensor, or a fingerprint sensor. The sensor module 240 may further include a control circuit for controlling at least one sensor included therein. In some embodiment, the electronic device 201 may further include a processor configured to control the sensor module 240 as part of or separately from the processor 210, to control the sensor module 240 during a sleep state of the processor 210.

The input device 250 may include, for example, a touch panel 252, a (digital) pen sensor 254, a key 256, or an ultrasonic input device 258. The touch panel 252 may use at least one of a capacitive type, a resistive type, an IR type, or an ultrasonic type. The touch panel 252 may further include a control circuit. The touch panel 252 may further include a tactile layer to provide tactile reaction to the user. The (digital) pen sensor 254 may include a recognition sheet which is a part of the touch panel 252 or a separate recognition sheet. The key 256 may also include a physical button, an optical key, or a keypad. The ultrasonic input device 258 senses ultrasonic waves generated by an input means through a microphone (e.g., the microphone 288) and checks data corresponding to the sensed ultrasonic waves.

The display 260 (e.g., the display 160) may include a panel 262, a hologram device 264, a projector 266, or a control circuit for controlling them. The panel 262 may be implemented to be flexible, transparent, or wearable. The panel 262 may be configured with the touch panel 252 in one module. According to an embodiment of the present disclosure, the panel 262 may include a pressure sensor (or a "force sensor") capable of measuring a strength of a pressure by a user's touch. The pressure sensor may be implemented integrally with the touch panel 252 or may be implemented as one or more sensors separate from the touch panel 252. The hologram device 264 may show a stereoscopic image in the air by using interference of light. The projector 266 may display an image onto a screen through projection of light. The screen may be positioned inside or outside the electronic device 201. The interface 270 may include an HDMI 272, a USB 274, an optical interface 276, or a D-subminiature (D-sub) 278. The interface 270 may be included in the communication interface 170 illustrated in FIG. 1. Additionally or alternatively, the interface 270 may include a mobile high-definition link (MHL) interface, an SD/multi-media card (MMC) interface, or an Infrared Data Association (IrDA) interface.

The audio module 280 may bi-directionally convert sound and an electric signal. At least one element of the audio module 280 may be included in the input/output interface 145 illustrated in FIG. 1. The audio module 280 may process sound information input or output through the speaker 282, the receiver 284, the earphone 286, or the microphone 288. The camera module 291 may be, for example, a device capable of capturing a still image or a moving image, and according to an embodiment, may include one or more image sensors (e.g., a front sensor or a rear sensor), a lens, an image signal processor (ISP), or a flash (e.g., an LED, a xenon lamp, etc.). The power management module 295 may manage power of the electronic device 201. According to an embodiment of the present disclosure, the power management module 295 may include a power management integrated circuit (PMIC), a charger IC, or a battery fuel gauge. The PMIC may have a wired or wireless charging scheme. The wireless charging scheme may further include a magnetic-resonance type, a magnetic induction type, and an electromagnetic type, and may further include an additional circuit for wireless charging, for example, a coil loop, a resonance circuit, a rectifier, etc. The battery gauge may measure the remaining capacity of the battery 296 or the voltage, current, or temperature of the battery 296 during charging. The battery 296 may include, for example, a rechargeable battery or a solar battery.

The indicator 297 displays a particular state, for example, a booting state, a message state, or a charging state, of the electronic device 201 or a part thereof (e.g., the processor 210). The motor 298 may convert an electric signal into mechanical vibration or generates vibration or a haptic effect. The electronic device 201 may include a device for supporting the mobile TV (e.g., a GPU) to process media data according to a standard such as digital multimedia broadcasting (DMB), digital video broadcasting (DVB), or mediaFlo™. Each of the foregoing elements described herein may be configured with one or more components, names of which may vary with a type of the electronic device. In various embodiments of the present disclosure, some components of the electronic device (e.g., the electronic device 201) may be omitted or may further include other elements, and some of the components may be coupled to form one entity and identically perform functions of the components before being coupled.

Figure 3:
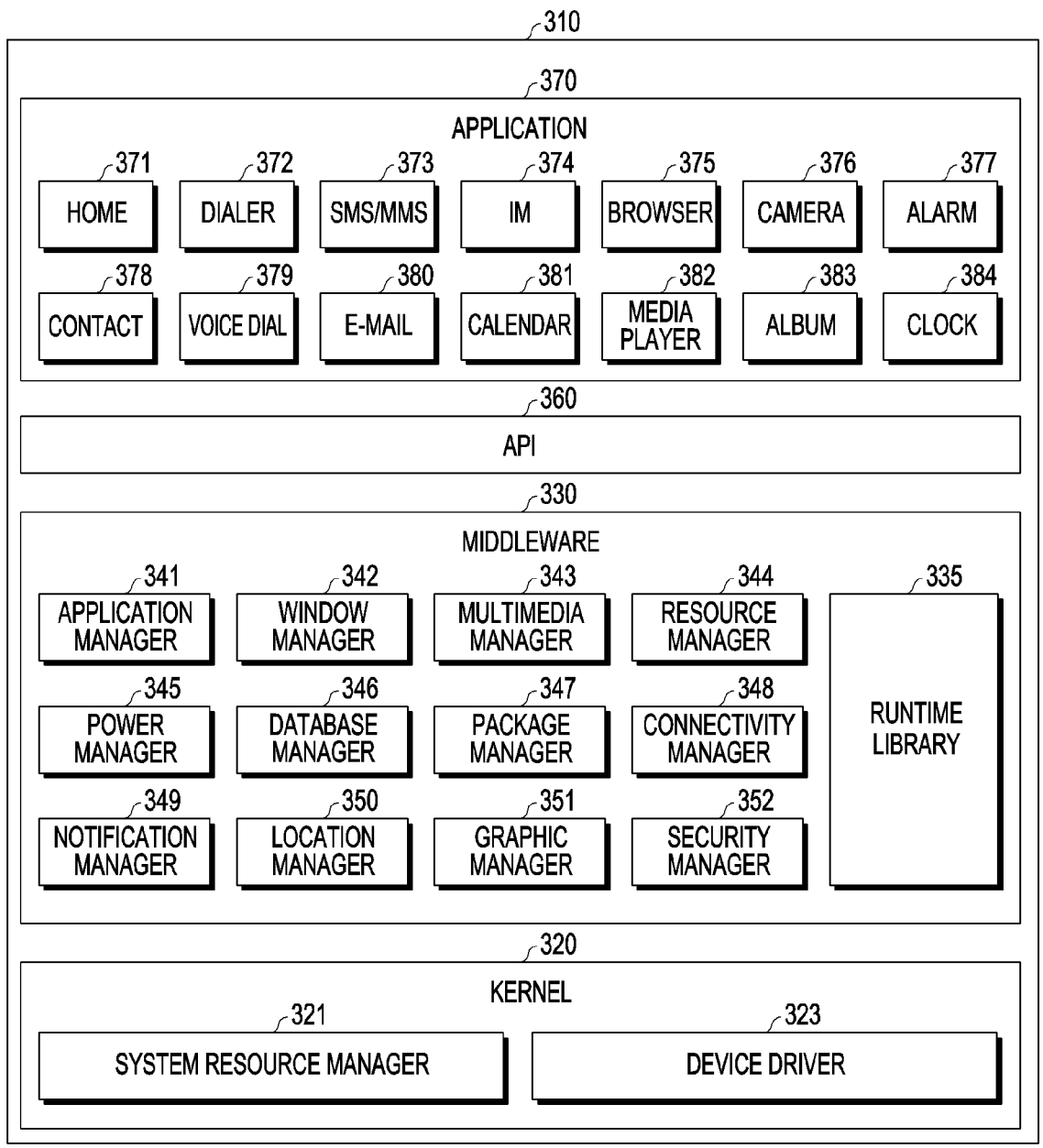
FIG. 3 is a block diagram of a programming module according to various embodiments of the present disclosure.

FIG. 3 is a block diagram of a programming module according to various embodiments of the present disclosure. According to an embodiment of the present disclosure, a programming module 310 (e.g., the program 140) may include an OS for controlling resources associated with an electronic device (e.g., the electronic device 101) or various applications (e.g., the application program 147) executed on the OS. The OS may include Android™, iOS™, Windows™, Symbian™, Tizen™, or Bada™. Referring to FIG. 3, the programming module 310 may include a kernel 320 (e.g., the kernel 141), middleware 330 (e.g., the middleware 143), an application programming interface (API) 360 (e.g., the API 145), or an application 370 (e.g., the application program 147). At least a part of the programming module 310 may be preloaded on an electronic device or may be downloaded from an external device (e.g., the electronic device 102 or 104, or the server 106).

The kernel 320 may include a system resource manager 321 or a device driver 323. The system resource manager 321 may perform control, allocation, retrieval of system resources, and so forth. According to an embodiment of the present disclosure, the system resource manager 321 may include a process management unit, a memory management unit, or a file system management unit. The device driver 323 may include, for example, a display driver, a camera driver, a Bluetooth driver, a shared memory driver, a USB driver, a keypad driver, a WiFi driver, an audio driver, or an inter-process communication (IPC) driver. The middleware 330 may include provide functions that the application 370 commonly requires or provide various functions to the application 370 through the API 360 to allow the application 370 to use a limited system resource in an electronic device. According to an embodiment of the present disclosure, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses to add a new function through a programming language while the application 370 is executed. The runtime library 335 performs input/output management, memory management, or calculation function processing. The application manager 341 may manage a life cycle of the applications 370. The window manager 342 may manage a graphic user interface (GUI) resource used in a screen. The multimedia manager 343 may recognize a format necessary for playing media files and perform encoding or decoding on a media file by using a codec appropriate for a corresponding format. The resource manager 344 may manage a source code or a memory space of the applications 370. The power manager 345 may manage, for example, a capacity, a temperature, or power of a battery and determines or provides power information necessary for an operation of the electronic device using corresponding information. According to an embodiment, the power manager 345 may operate with basic input/output system (BIOS). The database manager 346 may generate, search or change a database used for at least one application among the applications 370. The package manager 347 may manage the installation or update of an application distributed in a package file format.

The connectivity manager 348 may manage a wireless connection. The notification manager 349 may provide an event, e.g., an arriving message, an appointment, proximity notification, etc. The location manager 350 may manage location information about an electronic device. The graphic manager 351 may manage, for example, a graphic effect to be provided to a user or a user interface relating thereto. The security manager 352 may provide, for example, system security or user authentication. According to an embodiment of the present disclosure, the middleware 330 may further include a telephony manager for managing a voice or video call function of the electronic device or a middleware module forming a combination of functions of the above-described components. According to an embodiment of the present disclosure, the middleware 330 may provide a module specified for each type of an OS. Additionally, the middleware 330 may delete some of existing elements or add new elements dynamically. The API 360 may be provided as a set of API programming functions with a different configuration according to the OS. In the case of Android or iOS, for example, one API set may be provided by each platform, and in the case of Tizen, two or more API sets may be provided.

The application 370 may include one or more applications capable of providing a function, for example, a home application 371, a dialer application 372, a short messaging service/multimedia messaging service (SMS/MMS) application 373, an instant message (IM) application 374, a browser application 375, a camera application 376, an alarm application 377, a contact application 378, a voice dial application 379, an e-mail application 380, a calendar application 381, a media player application 382, an album application 383, a clock application 384, a health care application (e.g., an application for measuring an exercise amount, a blood sugar, etc.), or an environment information providing application (e.g., an application for providing air pressure, humidity, or temperature information or the like). According to an embodiment, the application 370 may include an information exchange application supporting information exchange between the electronic device and an external electronic device. The information exchange application may include, for example, a notification relay application for transferring specific information to the external electronic device or a device management application for managing the external electronic device. For example, the notification relay application may deliver notification information generated in another application of the electronic device to an external electronic device or may receive notification information from the external electronic device and provide the notification information to the user. The device management application may manage (e.g., install, remove, or update) a function (e.g., turn on/turn off of an external electronic device itself (or a part thereof) or control of brightness (or resolution) of a display) of an external device communicating with the electronic device, a service provided by an application operating in an external electronic device or provided by the external electronic device (e.g., a call service or a message service). According to an embodiment, the application 370 may include an application (e.g., health care application of mobile medical equipment) designated according to an attribute of the external electronic device. According to an embodiment, the application 370 may include an application received from the external electronic device. The at least a part of the programming module 310 may be implemented (e.g., executed) by software, firmware, hardware (e.g., the processor 210), or a combination of two or more of them, and may include, for example, modules, programs, routines, sets of instructions, or processes for performing one or more functions.

A term "module" used herein may mean, for example, a unit including one of or a combination of two or more of hardware, software, and firmware, and may be used interchangeably with terms such as logic, a logic block, a part, or a circuit. The "module" may be a part configured integrally, a minimum unit or a portion thereof performing one or more functions. The "module" may be implemented mechanically or electronically, and may include an application-specific integrated circuit (ASIC) chip, field-programmable gate arrays (FPGAs), and a programmable-logic device performing certain operations already known or to be developed. At least a part of an apparatus (e.g., modules or functions thereof) or a method (e.g., operations) according to various embodiments may be implemented with an instruction stored in a computer-readable storage medium (e.g., the memory 130) in the form of a programming module. When the instructions are executed by a processor (for example, the processor 120), the processor may perform functions corresponding to the instructions. The computer-readable recording medium includes hard disk, floppy disk, or magnetic media (e.g., a magnetic tape, optical media (e.g., compact disc read only memory (CD-ROM) or digital versatile disc (DVD), magneto-optical media (e.g., floptical disk), an embedded memory, and so forth. The instructions may include a code generated by a compiler or a code executable by an interpreter. Modules or programming modules according to various embodiments of the present disclosure may include one or more of the foregoing elements, have some of the foregoing elements omitted, or further include additional other elements. Operations performed by the module, the program, or another component according to various embodiments may be carried out sequentially, in parallel, repeatedly, or heuristically, or one or more of the operations may be executed in a different order or omitted, or one or more other operations may be added.

According to various embodiments of the present disclosure, an electronic device (e.g., 400 of FIG. 4) may include at least one of an industrial or home robot, an automated teller machine (ATM) of a financial institution, a Point of Sales (POS) of a store, an Internet of Things (IoT) device, an artificial intelligence electronic device, or a home device. For example, the home device, which is of a smart home device type, may transmit and receive information to and from another inhouse electronic device, a user's mobile device, or external communication devices through a communication network. The electronic device (e.g., 400 of FIG. 4) of the home device type may provide convenience of living by providing various services needed for living at home to the user, and provide related information to allow the user to know various situations occurring at home and corresponding information without user's direct recognition thereof.

A structure of the electronic device 400 including a pogo module 500 according to various embodiments of the present disclosure will be described in detail as below.

Figure 4:
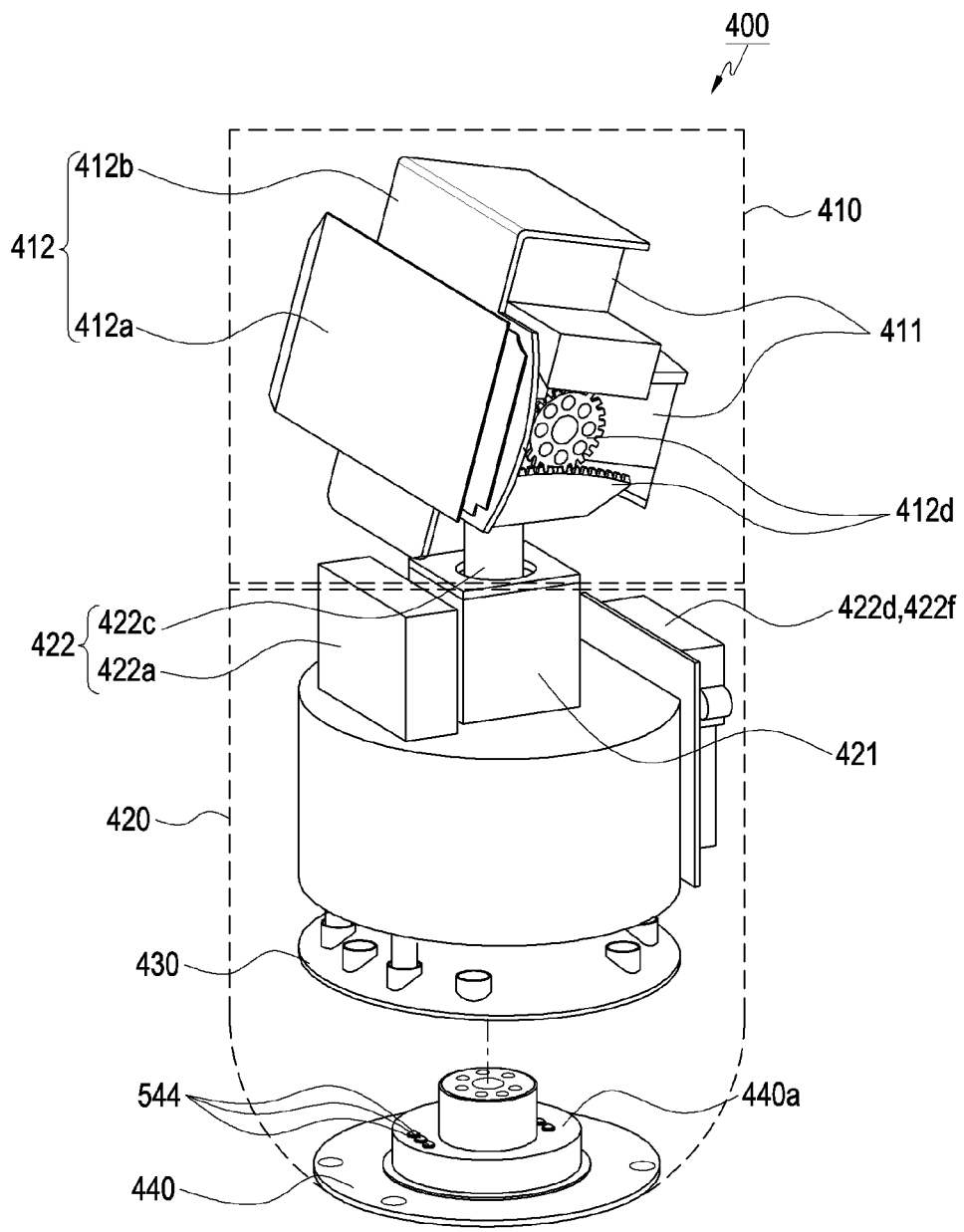
FIG. 4 is an exploded perspective view illustrating an entire structure of an electronic device including a pogo module according to various embodiments of the present disclosure.
Figure 5A:
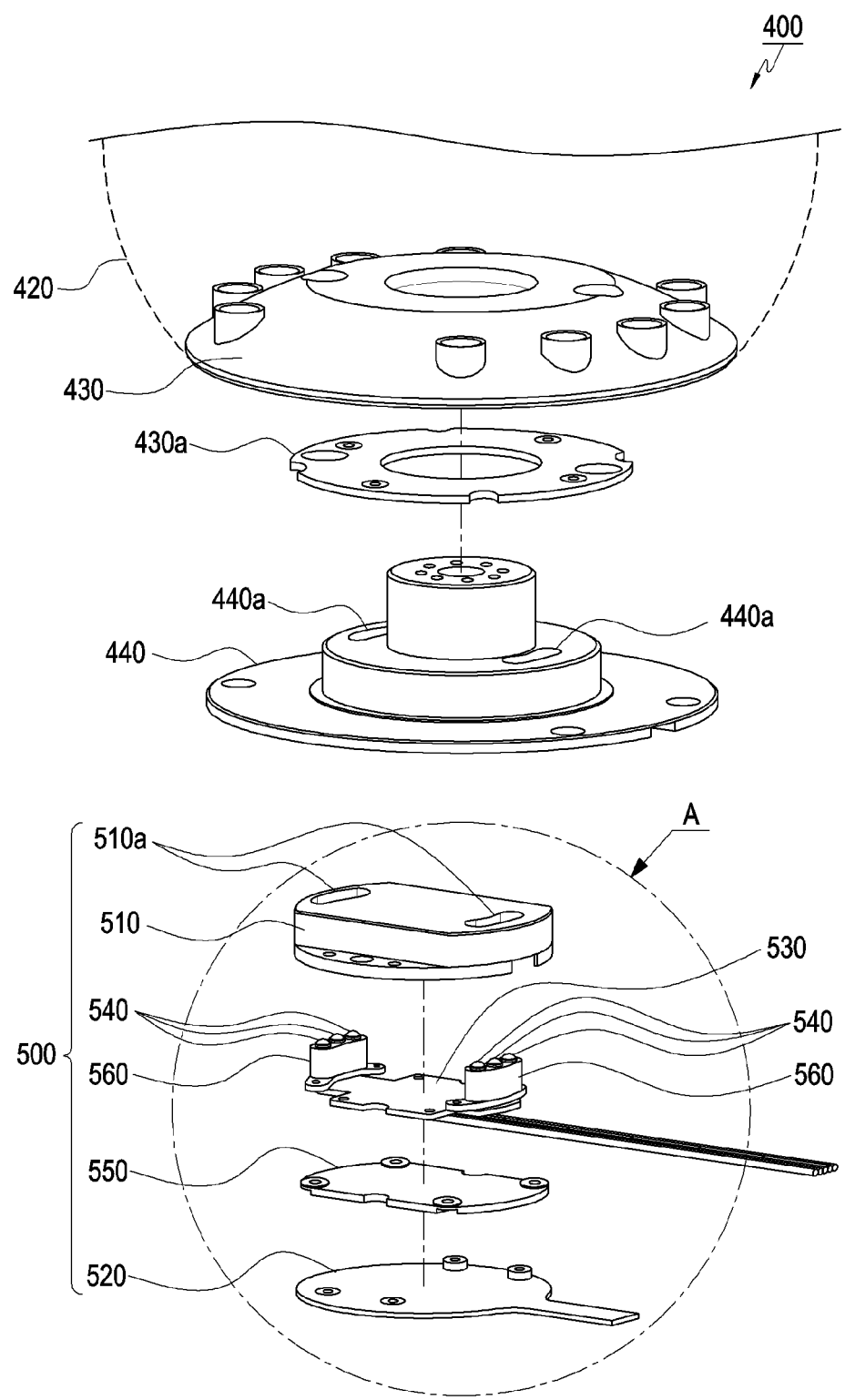
FIG. 5A is an exploded perspective view illustrating a structure of an electronic device including a pogo module according to various embodiments of the present disclosure.
Figure 5B:
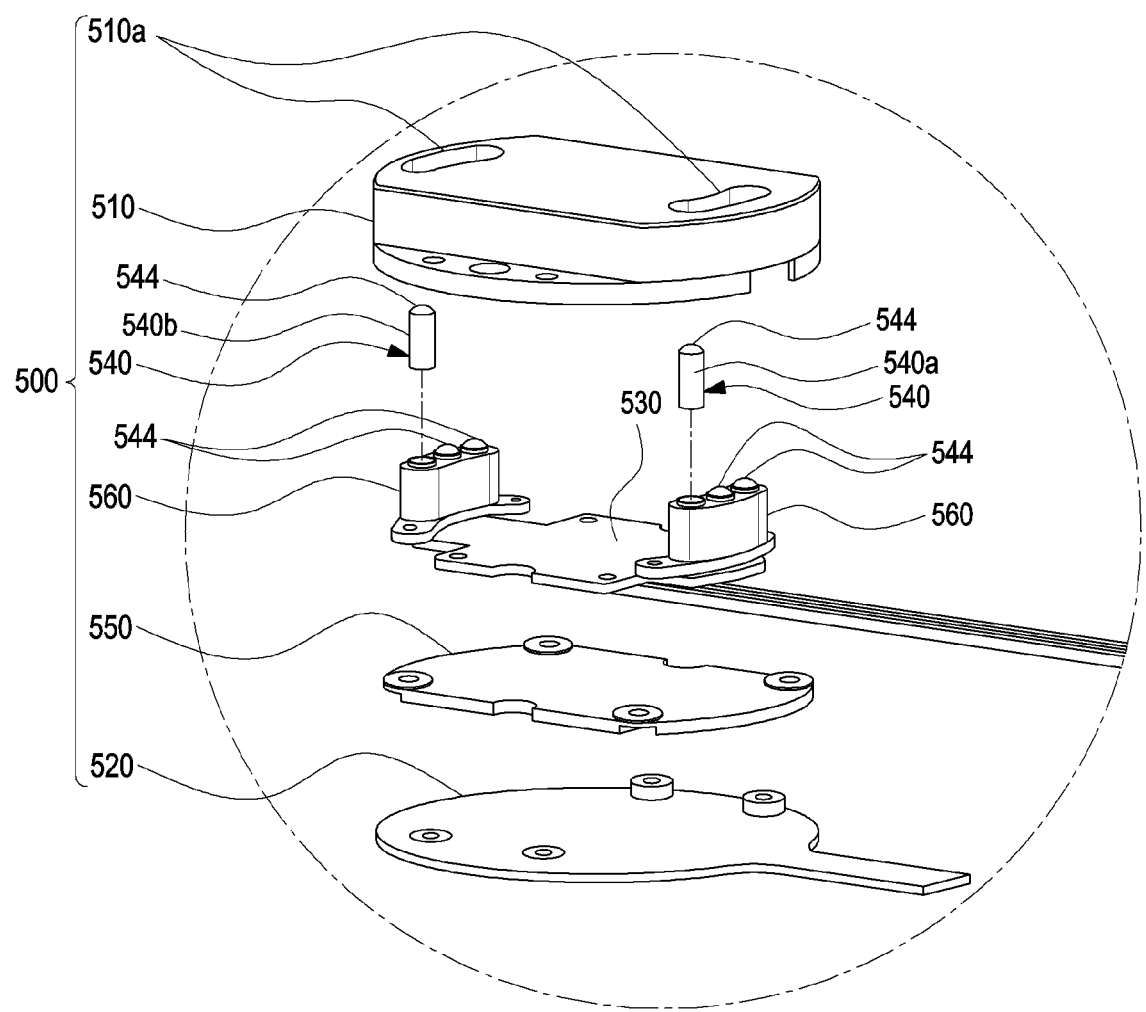
FIG. 5B is an enlarged exploded perspective view of a portion A of FIG. 5A.

FIG. 4 is an exploded perspective view illustrating an entire structure of the electronic device 400 including the pogo module 500 according to various embodiments of the present disclosure, FIG. 5A is an exploded perspective view illustrating a structure of the electronic device 400 including the pogo module 500 according to various embodiments of the present disclosure, and FIG. 5B is an enlarged exploded perspective view of a portion A of FIG. 5A.

Referring to FIG. 4, the electronic device 400 including the pogo module 500 may include a first rotating housing 410, a second rotating housing 420, a rotating body 430, a stationary body 440, and the pogo module 500.

One or more first driving motors 411 and a plurality of first components 412 may be included inside the first rotating housing 410, and the first rotating housing 410 may rotate or move along a plurality of driving gears 412d on the second rotating housing 420 by the first driving motors 411.

The plurality of first components 412 may include a display 412a, an electronic component 412b, a plurality of connection jacks, and the plurality of driving gears 412d. In the current embodiment, various components other than the disclosed first components 412 may be included.

One or more second driving motors 421 and a plurality of second components 422 may be included inside the second rotating housing 420, and the second rotating housing 420 may rotate or move along a plurality of gears 422c under the first rotating housing 410 by the second driving motors 421.

The plurality of second components 422 may include a battery 422a, an electronic component, a plurality of driving gears 422c, a control 422d, a plurality of connection jacks, and a power board 422f. In the current embodiment, various components other than the disclosed second components 422 may be included.

The second rotating housing 420 may rotatably face the first rotating housing 410 on the first rotating housing 410.

The rotating body 430 may be included in any one of the first rotating housing 410 and the second rotating housing 420 to include a printed circuit board 430a including electrode patterns 431 and 432 and to rotate with respect to a rotation axis C1.

The stationary body 440 may be fixed on the ground and may be included in any one of the first rotating housing 410 and the second rotating housing 420 to include the pogo module 500 electrically connected to the electrode patterns 431 and 432, facing the electrode patterns 431 and 432.

The stationary body 440 may be fixed on the ground and may be included in any one of the first rotating housing 410 and the second rotating housing 420 to include the printed circuit board 430a including the electrode patterns 431 and 432 and to rotate with respect to the rotation axis C1.

The rotating body 430 may be included in any one of the first rotating housing 410 and the second rotating housing 420 to include the pogo module 500 electrically connected to the electrode patterns 431 and 432, facing the electrode patterns 431 and 432.

For example, the pogo module 500 may be included in any one of the rotating body 430 and the stationary body 440. That is, when the pogo module 500 is mounted on the rotating body 430, the printed circuit board 430a including the electrode patterns 431 and 432 may be mounted on the stationary body 440 facing the rotating body 430; whereas when the pogo module 500 is mounted on the stationary body 440, the printed circuit board 430a including the electrode patterns 431 and 432 may be mounted on the rotating body 430 facing the stationary body 440.

As such, when the pogo module 500 is mounted on the rotating body 430, the printed circuit board 430a that is a counterpart may be mounted on the stationary body 440; whereas when the pogo module 500 is mounted on the stationary body 440, the printed circuit board 430a that is the counterpart may be mounted on the rotating body 430.

For example, the rotating body 430 and the stationary body 440 may be included in the second rotating housing 420, and the rotating body 430 may be coupled with the stationary body 440 to rotate with respect to the rotation axis C1 on the stationary body 440.

According to an embodiment of the present disclosure, the pogo module 500 may be coupled with a coupling portion formed in the stationary body 440, and at least one pogo pin 540 included in the pogo module 500 may be coupled with a protruding hole 440a formed in the stationary body 440 and protrude outwardly. The protruding pogo pin 540 may electrically contact the electrode patterns 431 and 432 of the printed circuit board 430a.

As illustrated in FIGS. 5A and 5B, the pogo pin 500 may include a first housing 510, a second housing 520, a module circuit board 530, the at least one pogo pin 540, and a support body 550. For example, the module circuit board 530, the at least one pogo pin 540, and the support body 550 may be included inside the first housing 510 and the second housing 520.

According to an embodiment of the present disclosure, the module circuit board 530 may include at least one pin coupling portion 560 so as to be coupled with, while being electrically connected to, the at least one pogo pin 540. The at least one pogo pin 540 may include a rotatable structure 544 electrically connected to the electrode patterns 431 and 432 and may be coupled with the at least one pin coupling portion 560 of the module circuit board 530.

The rotatable structure 544 may include a spin ball or a cylindrical structure. In the current embodiment of the present disclosure, the spin ball or the cylindrical structure will be described as an example for the rotatable structure 544, but the rotatable structure 544 is not limited to the example. That is, as the rotatable structure 544, any structure rotating in contact with the electrode patterns 431 and 432 may be applied variously. For example, the rotatable structure may include a ball bearing.

The support body 550 may be coupled with the module circuit board 530 to support the at least one pogo pin 540 and the module circuit board 530.

According to an embodiment of the present disclosure, the rotatable structure 544 may maintain an electrical connection with the electrode patterns 431 and 432 of the printed circuit board 430a in rotation or non-rotation of the first rotating housing 410 and the second rotating housing 420. For example, the first housing 510 may include at least one mounting portion 510a to allow coupling with the at least one pogo pin 540 while exposing the rotatable structure 544 to outside. The at least one mounting portion 510a may include a through hole such that the at least one pogo pin 540 may be coupled through the at least one mounting portion 510a while exposing the rotatable structure 544 to outside.

The pogo module 500 assembled in this way may be coupled with the coupling portion formed on a rear surface of the stationary body 440, and the rotatable structure 544 of the pogo pin 540 may be exposed to outside by being coupled with the protruding hole 440a formed in the stationary body 440. The electrode patterns 431 and 432 of the printed circuit board 430a may electrically contact the rotatable structure 544 exposed to outside.

Thus, when the first rotating housing 410 and the second rotating housing 420 rotate, the rotating body 430 included in the second rotating housing 420 may rotate and at the same time, the printed circuit board 430a included in the rotating body 430 may also rotate. In this state, the electrode patterns 431 and 432 included in the printed circuit board 430a may also rotate while maintaining an electrical connection with the rotatable structure 544.

According to various embodiments of the present disclosure, with the pogo module 500 including the pogo pin 540 that makes and maintains an electrical connection in rotation of the rotating body 430, components of the electronic device 400 may be electrically connected without a cable, and for example, power may be supplied to charge the battery 422a included in the second rotating housing 420 and the power of the charged battery 422a may be delivered to each of the components. An electrical signal may be delivered to each of components included in the first and second rotating housings 410 and 420. The pogo module 500 may supply the power to the battery 422a and deliver an electrical signal to each component by continuously maintaining an electrical connection with the electrode patterns 431 and 432 of the printed circuit board 430a.

The electrode patterns 431 and 432 according to various embodiments of the present disclosure will be described in more detail as below.

Figure 6:
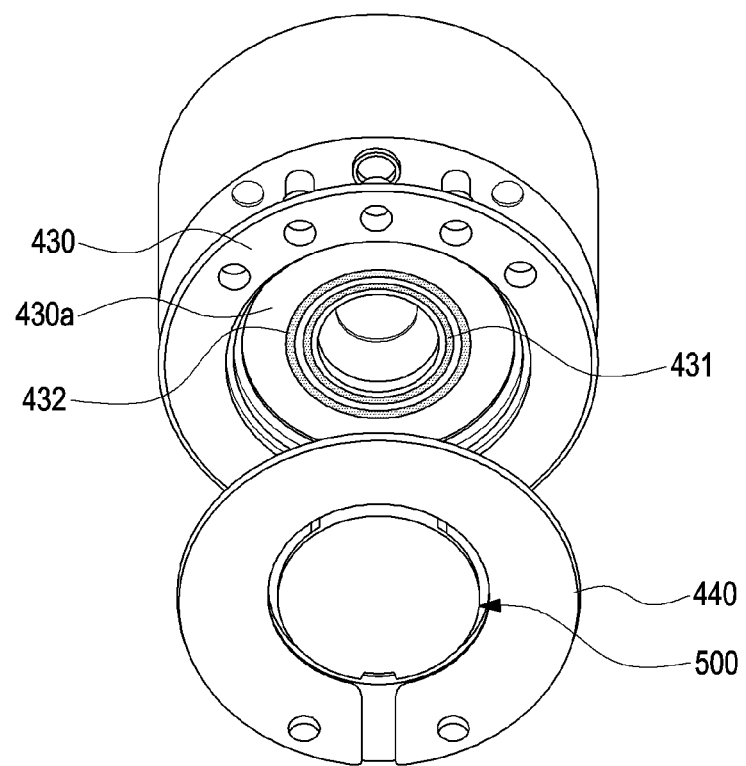
FIG. 6 is an exploded perspective view illustrating a state before a rotating body and a stationary body are coupled with each other in an electronic device including a pogo module according to various embodiments of the present disclosure.
Figure 7:
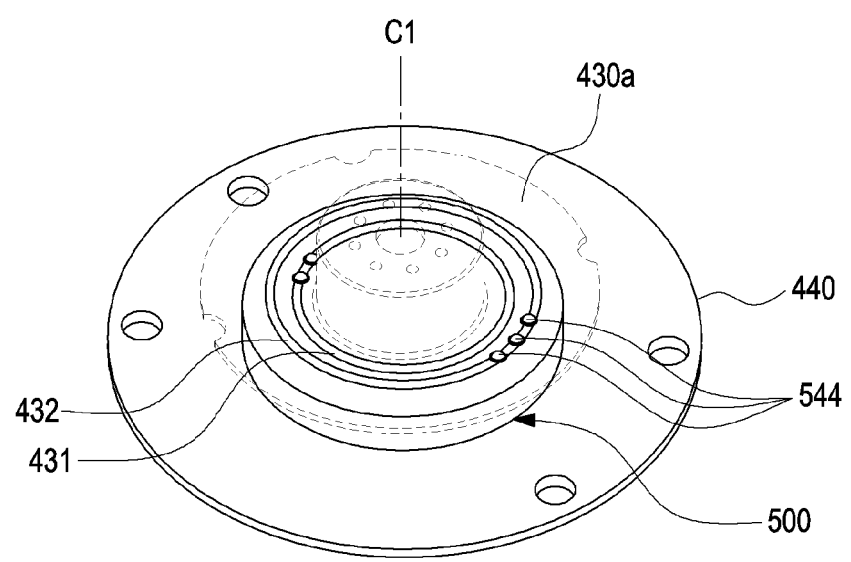
FIG. 7 is a perspective view illustrating a state where a rotating body and a stationary body are coupled with each other in an electronic device including a pogo module according to various embodiments of the present disclosure.

FIG. 6 is an exploded perspective view illustrating a state before the rotating body 430 and the stationary body 440 are coupled with each other in the electronic device 400 including the pogo module 500 according to various embodiments of the present disclosure, and FIG. 7 is a perspective view illustrating a state where the rotating body 430 and the stationary body 440 are coupled with each other in the electronic device 400 including the pogo module 500 according to various embodiments of the present disclosure.

Referring to FIGS. 6 and 7, the electrode patterns 431 and 432 may include the electrode patterns 431 and 432 that have a ring shape. The electrode patterns 431 and 432 that have a ring shape may be formed around a central portion of the printed circuit board 430a. In the current embodiment of the present disclosure, the electrode patterns 431 and 432 are not limited to a ring shape. The electrode patterns 431 and 432 may be applied variously as long as the electrode patterns 431 and 432 may maintain an electrical connection with the rotatable structure 544 of the pogo pin 540. For example, the electrode patterns 431 and 432 may include the electrode patterns 431 and 432 having an oval shape and the electrode patterns 431 and 432 having a circular shape.

According to an embodiment of the present disclosure, the electrode patterns 431 and 432 may include a first terminal and a second terminal to which charging current is input. An electrical signal of a component as well as the charging current may also be input to the first and second terminals. For example, the first terminal and the second terminal may be applied variously as long as they may maintain an electrical connection with the rotatable structure 544 of the pogo pin 540. For example, the first terminal and the second terminal may include a transmission/reception terminal, a control terminal for controlling a driving motor, and terminals for inputting/outputting a signal of various electronic components.

The first terminal 431 may be arranged close to a circumference of the central portion of the printed circuit board 430a, and the second terminal 432 may be arranged on an outer circumference of the first terminal 431.

According to an embodiment of the present disclosure, the at least one pogo pin 540 may be arranged in a position facing the electrode patterns 431 and 432. For example, the at least one pogo pin 540 may include a first pogo pin 540a and a second pogo pin 540b, in which the rotatable structure 544 of the first pogo pin 540a may be electrically connected to the first terminal 431 and the rotatable structure 544 of the second pogo pin 540b may be electrically connected to the second terminal 432.

According to an embodiment of the present disclosure, the first pogo pin 540a and the second pogo pin 540b may be arranged to correspond to the first and second terminals 431 and 432. When the second rotating housing 420 rotates with respect to the rotation axis C1, the printed circuit board 430a may also rotate and the first and second terminals 431 and 432 may also rotate together with the printed circuit board 430a. The first and second terminals 431 and 432 may rotate while maintaining an electrical connection with the rotatable structure 544 of the first and second pogo pins 540a and 540b.

The pogo module 500 according to various embodiments of the present disclosure will be described in detail as below.

Figure 8:
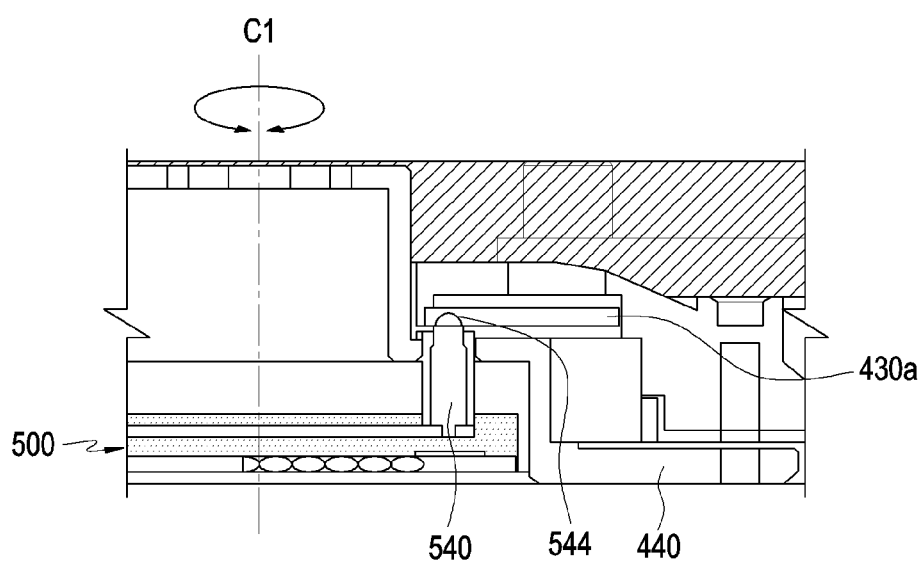
FIG. 8 is a side view illustrating a state where a rotating body and a stationary body are coupled with each other in an electronic device including a pogo module according to various embodiments of the present disclosure.
Figure 9:
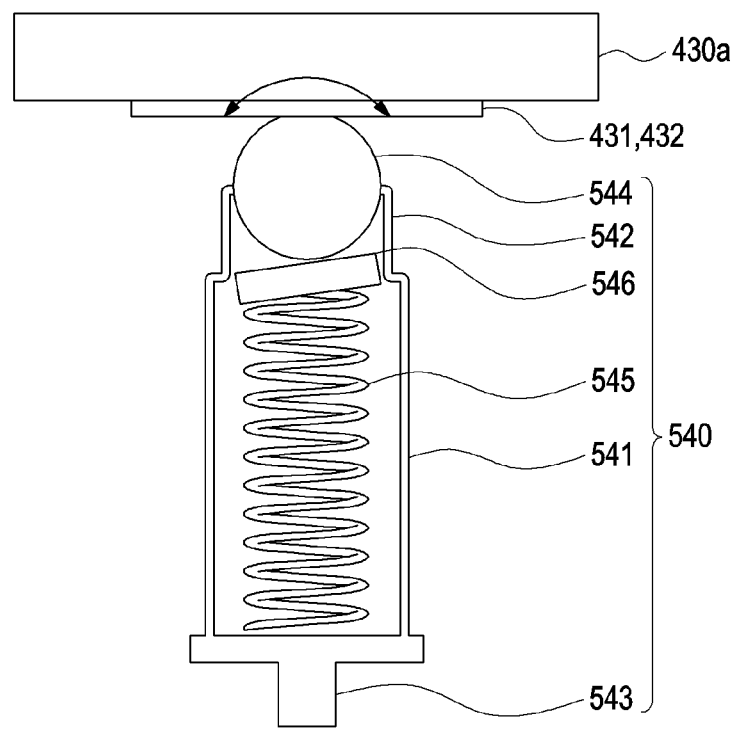
FIG. 9 is a side cross-sectional view illustrating a structure of a pogo module in an electronic device including the pogo module according to various embodiments of the present disclosure.

FIG. 8 is a side view illustrating a state where a rotating body and a stationary body are coupled with each other in an electronic device including a pogo module according to various embodiments of the present disclosure, and FIG. 9 is a side cross-sectional view illustrating a structure of the pogo module 500 in the electronic device 400 including the pogo module 500 according to various embodiments of the present disclosure.

Referring to FIGS. 8 and 9, the at least one pogo pin 540 may include a pin housing 541, a plunger 542, a connection terminal 543, the rotatable structure 544, an elastic member 545, and a support member 546.

The pin housing 541 may include the rotatable structure 544, the elastic member 545, and the support member 546 therein.

The plunger 542 may be included in a first end of the pin housing 541 in such a way to be coupled with the rotatable structure 544 and to support rotation of the rotatable structure 544.

The connection terminal 543 may be provided in a second end that is opposite the first end of the pin housing 541 in such a way to be electrically connected to the module circuit board 530.

The rotatable structure 544 may be rotatably coupled with the plunger 542, and may rotate in such a way to maintain an electrical connection with the electrode patterns 431 and 432 in rotation or non-rotation of the first and second rotating housings 410 and 420 of the electronic device 400.

The elastic member 545 may maintain a contact with the electrode patterns 431 and 432, and may be included in the pin housing 541 to provide an elastic force to the rotatable structure 544.

The support member 546 may be included between the rotatable structure 544 and the elastic member 545 to support the rotatable structure 544.

According to an embodiment of the present disclosure, the pogo module 500 assembled in this way may be coupled with the second rotating housing 420 of the electronic device 400. The pogo module 500 may be coupled by being inserted into the coupling portion formed on the rear surface of the stationary body 440. The rotatable structure 544 of the pogo module 500 may be coupled by being inserted into the protruding hole 440a of the stationary body 440 and may be exposed to outside by passing through the protruding hole 440a. In this state, the stationary body 440 may be coupled with the rotating body 430 included in the second rotating housing 420. The rotatable structure 544 exposed from the stationary body 440 may be electrically coupled and electrically connected to the electrode patterns 431 and 432 included in the printed circuit board 430a of the rotating body 430. Thus, the pogo module 500 may be assembled to the second rotating housing 420 of the electronic device 400.

According to an embodiment of the present disclosure, as in FIG. 4 mentioned above, the electronic device 400 completely assembled may fix the stationary body 440 on the ground and install the second rotating housing 420 on the ground, that is, fix the stationary body on the stationary body 440. The stationary body 440 may support the second rotating housing 420 to rotate from the ground. The first rotating housing 410 may be installed on the second rotating housing 420 to rotate. For example, the stationary body 440 included in the second rotating housing 420 may be fixed on the ground, and may face the rotating body 430 included in the second rotating housing 420. In this case, the electrode patterns 431 and 432 included in the printed circuit board 430a of the rotating body 430 may be electrically connected to the rotatable structure 544 of the pogo pin 540 of the stationary body 440 while facing the rotatable structure 544, in which the first and second rotating housings 410 and 420 have not rotated.

According to an embodiment of the present disclosure, the aforementioned processor (e.g., 210 of FIG. 2) may control execution of information, a program, an application or a function corresponding to an operation of the electronic device 400. The processor (e.g., 210 of FIG. 2) may perform a control operation for communication with peripheral devices. The processor (e.g., 210 of FIG. 2) may check a use state of the electronic device 400. Herein, the use state of the electronic device 400 includes information about a current operation state of the electronic device 400, and may mean execution of a program, an application, or a function of the electronic device 400. Upon receiving input information from outside during execution of rotation of the first and second rotating housings 410 and 420 of the electronic device 400, the processor (e.g., 210 of FIG. 2) may control power of the battery 422a included in the second rotating housing 420 to be supplied to the plurality of first and second driving motors 411 and 421 included in the first and second rotating housings 410 and 420 and control driving of the plurality of first and second driving motors 411 and 421. The processor may rotate the first and second rotating housings 410 and 420 by controlling driving of the first and second driving motors 411 and 421.

In this state, when the second rotating housing 420 rotates with respect to the rotation axis C1, the rotating body 430 included in the second rotating housing 420 may also rotate. Once the rotating body 430 rotates, the electrode patterns 431 and 432 of the printed circuit board 430a may also rotate, and the rotatable structure 544 may also rotate along with rotation of the electrode patterns 431 and 432, while being electrically grounded. For example, the pogo pin 540 included in the stationary body 440 is fixed or stationary, the rotatable structure 544 of the pogo pin 540 may rotate to support rotation of the electrode patterns 431 and 432.

Thus, as the rotatable structure 544 also rotates together with rotation of the electrode patterns 431 and 432, the electrode patterns 431 and 432 and the rotatable structure 544 may maintain an electrical connection therebetween. The elastic member 545 presses the rotatable structure 544 using an elastic force thereof, thus maintaining the connection with the electrode patterns 431 and 432.

According to an embodiment of the present disclosure, when the electrode patterns 431 and 432 and the rotatable structure 544 maintain the electrical connection therebetween, the processor (e.g., 210 of FIG. 2) may control the plurality of first and second driving motors to allow rotation of the first and second rotating housings 410 and 420, and may control a charging function signal for charging the battery 422a or a signal for actuating a plurality of first and second components included in the electronic device 400. The processor may also control a signal for performing the aforementioned various functions.

According to an embodiment of the present disclosure, the processor (e.g., 210 of FIG. 2) may control the plurality of second driving motors 421 to rotate the second rotating housing 420 with respect to the rotation axis C1, such that the rotating body 430 included in the second rotating housing 420 may also rotate. As the rotating body 430 rotates, the electrode patterns 431 and 432 of the printed circuit board 430a may also rotate together. The electrode patterns 431 and 432 may move by rolling while rotating in an electrically connected state with the rotatable structure 544 of the pogo pin 540.

Thus, by electrically connecting the electrode patterns 431 and 432 with the rotatable structure 544 of the pogo pin 540 without a cable in the first and second rotating housings 410 and 420, disconnection caused by twist of the cable may be prevented in rotation of the first and second rotating housings 410 and 420 with respect to the rotation axis C1, and an electrical connection may be maintained, thus supplying power to charge the battery 422a included in the electronic device 400 such that the charged battery 422a may deliver the power to components of the electronic device 400.

Another example of an electrode pattern according to another embodiment of the present disclosure will be described as below.

Figure 10:
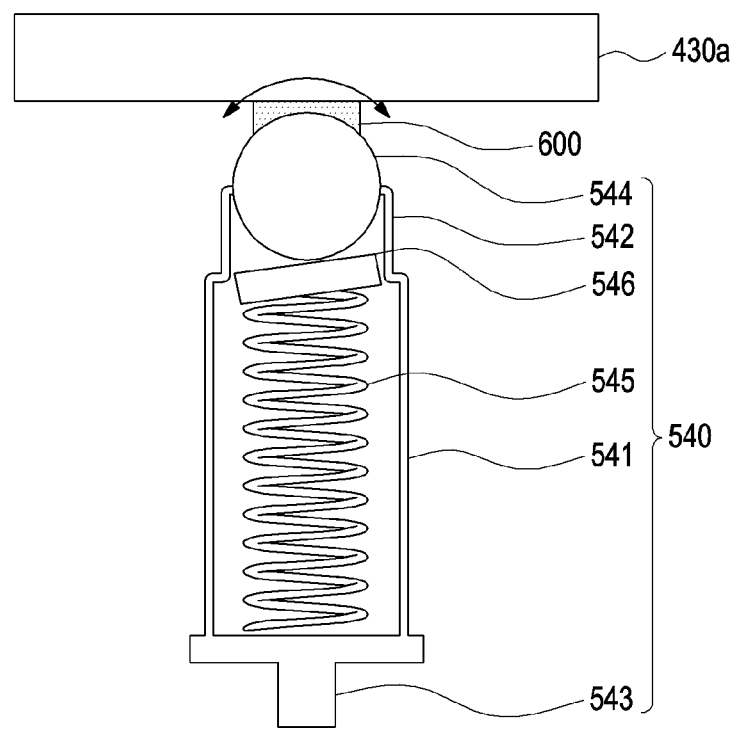
FIG. 10 is a side cross-sectional view illustrating another example of an electrode pattern in a structure of an electronic device including a pogo module according to various embodiments of the present disclosure.

FIG. 10 is a side cross-sectional view illustrating an electrode pattern 600 in a structure of the electronic device 400 including the pogo module 500 according to various embodiments of the present disclosure.

As shown in FIG. 10, the electrode pattern 600 may include an electrode pattern in a curved form. For example, the at least one pogo pin 540 may include the rotatable structure 544 which may maintain an electrical connection with the electrode pattern 600 in rotation of the first and second rotating housings 410 and 420 of the electronic device 400. The electrode pattern 600 and the rotatable structure 544 may contact each other to maintain an electrical connection.

According to an embodiment of the present disclosure, when the electrode pattern 600 is formed in a planar form, an area contacting the rotatable structure 544 is small, such that the electrode pattern 600 and the rotatable structure 544 are short-circuited from each other in rotation of the first and second rotating housings 410 and 420.

Thus, by forming the electrode pattern 600 in a curved form, the electrode pattern 600 in a curved form may electrically contact the rotatable structure 544 while surrounding the rotatable structure 544. The electrode pattern 600 in such a curved form may be prevented from being short-circuited from the rotatable structure 544 in rotation of the first and second rotating housings 410 and 420.

According to an embodiment of the present disclosure, as the electrode pattern 600 in the curved form electrically contacts the rotatable structure 544 while surrounding the rotatable structure 544, the first and second rotating housings 410 and 420 may stably maintain an electrical connection even when rotating freely in a plurality of directions.

According to various embodiments of the present disclosure, a pogo module including a pogo pin includes a first housing and a second housing, a module circuit board provided in the first housing and the second housing, at least one pogo pin provided in the module circuit board and including a rotatable structure electrically connected to at least one electrode pattern included in a printed circuit board of an electronic device, and a support body coupled with the module circuit board to support the at least one pogo pin, in which the rotatable structure maintains an electrical connection with the at least one electrode pattern in rotation or non-rotation of the electronic device.

According to various embodiments of the present disclosure, the first housing may include at least one mounting portion that is coupled with the at least one pogo pin and electrically connects the rotatable structure with the at least one electrode pattern while exposing the rotatable structure to outside.

According to various embodiments of the present disclosure, the at least one electrode pattern may include an electrode pattern in a ring shape.

According to various embodiments of the present disclosure, the at least one electrode pattern may include a first terminal and a second terminal to which power or an electrical signal is input.

According to various embodiments of the present disclosure, the at least one pogo pin may be arranged in a position facing the at least one electrode pattern.

According to various embodiments of the present disclosure, the at least one pogo pin may include a pin housing, a plunger provided in a first end of the pin housing, a connection terminal provided in a second end that is opposite the first end of the pin housing and electrically connected to the module circuit board,
 the rotatable structure rotatably coupled with the plunger and rotating to maintain an electrical connection with the at least one electrode pattern in rotation or non-rotation of the electronic device, an elastic member provided in the pin housing and providing an elastic force to the rotatable structure to maintain a connection with the at least one electrode pattern, and a support member provided between the rotatable structure and the elastic member to support the rotatable structure.

According to various embodiments of the present disclosure, the at least one electrode pattern may include an electrode pattern in a curved shape.

According to various embodiments of the present disclosure, the rotatable structure may include a spin ball or a cylindrical rotating structure.

According to various embodiments of the present disclosure, an electronic device including a pogo module includes a first rotating housing including a plurality of first driving motors and a plurality of first components therein and rotating by the plurality of first driving motors, a second rotating housing rotatably facing the first rotating housing, including a plurality of second driving motors and a plurality of second components therein, and rotating by the plurality of second driving motors, a rotating body included in any one of the first rotating housing and the second rotating housing, including a printed circuit board including at least one electrode pattern, and rotating, and a stationary body included in any one of the first rotating housing and the second rotating housing, being fixed on a ground, and including the pogo module that is electrically connected to the at least one electrode pattern, facing the at least one electrode pattern, in which the pogo module includes a first housing and a second housing, a module circuit board provided in the first housing and the second housing, at least one pogo pin provided in the module circuit board and including a rotatable structure electrically connected to the at least one electrode pattern, and a support body coupled with the module circuit board to support the at least one pogo pin and the module circuit board, in which the rotatable structure includes the pogo module that maintains an electrical connection with the at least one electrode pattern in rotation or non-rotation of the first rotating housing and the second rotating housing.

According to various embodiments of the present disclosure, the plurality of first components may include a display, an electronic component, a plurality of connection jacks, and a plurality of driving gears, and the plurality of second components may include a battery, an electronic component, a plurality of driving gears, a control, a plurality of connection jacks, and a power board.

According to various embodiments of the present disclosure, the at least one pogo pin may include a pin housing, a plunger provided in a first end of the pin housing, a connection terminal provided in a second end that is opposite the first end of the pin housing and electrically connected to the module circuit board, the rotatable structure rotatably coupled with the plunger and rotating to maintain an electrical connection with the at least one electrode pattern in rotation or non-rotation of the first rotating housing and the second rotating housing, an elastic member provided in the pin housing and providing an elastic force to the rotatable structure to maintain a connection with the at least one electrode pattern, and a support member provided between the rotatable structure and the elastic member to support the rotatable structure.

According to various embodiments of the present disclosure, the rotatable structure may include a spin ball or a cylindrical rotating structure.

According to various embodiments of the present disclosure, a connector module includes a first housing and a second housing, a circuit board provided in the first housing and the second housing, at least one connector provided in the circuit board and including a rotatable structure electrically connected to at least one electrode pattern included in a printed circuit board of an electronic device, and a support body coupled with the circuit board to support the at least one connector, in which the rotatable structure maintains an electrical connection with the at least one electrode pattern in rotation or non-rotation of the electronic device.

According to various embodiments of the present disclosure, the connector module may include a pogo module including a pogo pin.

The pogo module and the electronic device including the same according to various embodiments of the present disclosure described above are not limited by the above-described embodiments and drawings, and it would be apparent to those of ordinary skill in the art that various substitutions, modifications, and changes in the technical scope of the present disclosure may be possible.

The invention claimed is:

1. A pogo module comprising:
a first housing and a second housing;
a module circuit board provided in the first housing and the second housing;
at least one pogo pin provided in the module circuit board and comprising a rotatable structure electrically connected to at least one electrode pattern included in a printed circuit board of an electronic device; and
a support body coupled with the module circuit board to support the at least one pogo pin,
wherein the rotatable structure maintains an electrical connection with the at least one electrode pattern included in the printed circuit board of the electronic device in rotation or non-rotation of the electronic device, and
wherein the printed circuit board of the electronic device is included in a rotating body of the electronic device.

2. The pogo module of claim 1, wherein the first housing comprises at least one mounting portion that is coupled with the at least one pogo pin and electrically connects the rotatable structure to the at least one electrode pattern while exposing the rotatable structure to outside.

3. The pogo module of claim 1, wherein the at least one electrode pattern comprises an electrode pattern in a ring shape.

4. The pogo module of claim 1, wherein the at least one electrode pattern comprises a first terminal and a second terminal to which power or an electrical signal is input.

5. The pogo module of claim 1, wherein the at least one pogo pin is arranged in a position facing the at least one electrode pattern.

6. The pogo module of claim 1, wherein the at least one pogo pin comprises:
a pin housing;
a plunger provided in a first end of the pin housing;
a connection terminal provided in a second end that is opposite the first end of the pin housing and electrically connected to the module circuit board;
the rotatable structure rotatably coupled with the plunger and rotating to maintain an electrical connection with the at least one electrode pattern in rotation or non-rotation of the electronic device;
an elastic member provided in the pin housing and providing an elastic force to the rotatable structure to maintain a connection with the at least one electrode pattern; and
a support member provided between the rotatable structure and the elastic member to support the rotatable structure.

7. The pogo module of claim 1, wherein the at least one electrode pattern comprises an electrode pattern in a curved form.

8. The pogo module of claim 1, wherein the rotatable structure comprises a spin ball or a cylindrical rotating structure.

9. An electronic device comprising a pogo module, the electronic device comprising:

a first rotating housing comprising a plurality of first driving motors and a plurality of first components therein and rotating by the plurality of first driving motors;

a second rotating housing rotatably facing the first rotating housing, comprising a plurality of second driving motors and a plurality of second components therein, and rotating by the plurality of second driving motors;

a rotating body included in any one of the first rotating housing and the second rotating housing, comprising a printed circuit board including at least one electrode pattern, and rotating; and a stationary body included in any one of the first rotating housing and the second rotating housing, being fixed on a ground, and comprising the pogo module that is electrically connected to the at least one electrode pattern, facing the at least one electrode pattern, wherein the pogo module comprises:

a first housing and a second housing;

a module circuit board provided in the first housing and the second housing;

at least one pogo pin provided in the module circuit board and comprising a rotatable structure electrically connected to the at least one electrode pattern; and a support body coupled with the module circuit board to support the at least one pogo pin and the module circuit board, wherein the rotatable structure comprises the pogo module that maintains an electrical connection with the at least one electrode pattern in rotation or non-rotation of the first rotating housing and the second rotating housing.

10. The electronic device of claim 9, wherein the plurality of first components comprise a display, an electronic component, a plurality of connection jacks, and a plurality of driving gears, and the plurality of second components comprise a battery, an electronic component, a plurality of driving gears, a control, a plurality of connection jacks, and a power board.

11. The electronic device of claim 9, wherein the at least one pogo pin comprises:

a pin housing;

a plunger provided in a first end of the pin housing;

a connection terminal provided in a second end that is opposite the first end of the pin housing and electrically connected to the module circuit board;

the rotatable structure rotatably coupled with the plunger and rotating to maintain an electrical connection with the at least one electrode pattern in rotation or non-rotation of the first rotating housing and the second rotating housing;

an elastic member provided in the pin housing and providing an elastic force to the rotatable structure to maintain a connection with the at least one electrode pattern; and a support member provided between the rotatable structure and the elastic member to support the rotatable structure.

12. The electronic device of claim 9, wherein the rotatable structure comprises a spin ball or a cylindrical rotating structure.

13. A connector module comprising:

a first housing and a second housing;

a circuit board provided in the first housing and the second housing;

at least one connector provided in the circuit board and comprising a rotatable structure electrically connected to at least one electrode pattern included in a printed circuit board of an electronic device; and a support body coupled with the circuit board to support the at least one connector, wherein the rotatable structure maintains an electrical connection with the at least one electrode pattern included in the printed circuit board of the electronic device in rotation or non-rotation of the electronic device, and wherein the printed circuit board of the electronic device is included in a rotating body of the electronic device.

14. The connector module of claim 13, wherein the connector module comprises a pogo module comprising a pogo pin.

* * * * *